United States Patent
Khan et al.

(10) Patent No.: US 7,251,464 B2
(45) Date of Patent: Jul. 31, 2007

(54) METHOD AND APPARATUS FOR PREDISTORTION TRAINING IN AN AMPLIFIER UTILIZING PREDISTORTION

(75) Inventors: Andrew M. Khan, Schaumburg, IL (US); Christopher P. Thron, Austin, TX (US); Curtis M. Williams, Schaumburg, IL (US); George F. Opas, Park Ridge, IL (US)

(73) Assignee: Motorola, Inc., Schaumburg, IL (US)

( * ) Notice: Subject to any disclaimer, the term of this patent is extended or adjusted under 35 U.S.C. 154(b) by 358 days.

(21) Appl. No.: 10/958,091

(22) Filed: Oct. 4, 2004

(65) Prior Publication Data

US 2005/0085199 A1    Apr. 21, 2005

Related U.S. Application Data

(60) Provisional application No. 60/511,969, filed on Oct. 16, 2003.

(51) Int. Cl.
*H04B 1/04* (2006.01)
(52) U.S. Cl. .................... 455/114.3; 375/297
(58) Field of Classification Search ............ 455/114.2, 455/114.3, 126, 127.2; 375/296, 297; 330/149
See application file for complete search history.

(56) References Cited

U.S. PATENT DOCUMENTS

| | | | | |
|---|---|---|---|---|
| 5,867,065 A * | 2/1999 | Leyendecker | ............... | 330/149 |
| 5,929,703 A * | 7/1999 | Sehier et al. | ............... | 330/149 |
| 6,072,364 A * | 6/2000 | Jeckeln et al. | ............... | 330/149 |
| 6,240,144 B1 | 5/2001 | Ha | | |
| 6,928,122 B2 * | 8/2005 | Opas et al. | ................. | 375/296 |
| 2005/0140438 A1 * | 6/2005 | Jin et al. | .................... | 330/149 |

FOREIGN PATENT DOCUMENTS

GB       2376584 A     12/2002
WO   WO01/80471 A2   10/2001

* cited by examiner

*Primary Examiner*—Nguyen T. Vo

(57) ABSTRACT

A method and apparatus for predistortion training in an amplifier using predistortion is provided herein. Predistortion takes place by collecting a series of envelope errors and averaging the envelope errors for various amplitude regions. LUT values are modified based on a curve-fit to the average amplitude values for each amplitude region. By utilizing a curve-fitting technique, the pitfalls of modifying individual LUT coefficients is avoided. Particularly, because the errors are collected in relatively broad regions and then averaged, the importance of exact correlation between a measured error and a specific LUT entry is significantly lessened.

14 Claims, 5 Drawing Sheets

METHOD AND APPARATUS FOR PREDISTORTION TRAINING IN AN AMPLIFIER UTILIZING PREDISTORTION

FIELD OF THE INVENTION

The present invention relates generally to amplifiers and in particular, to a method and apparatus for predistortion training in an amplifier using predistortion.

BACKGROUND OF THE INVENTION

A challenge for a digital predistortion linearization system is to create and maintain accuracy of the look up table (LUT) in presence of a changing power amplifier (PA) nonlinearity characteristics. Typical implementations of digital predistortion use a lookup table that contains a predistortion amount as a function of input signal amplitude. In other words, an input signal that is fed into the amplifier will also be directed to a "lookup table" (LUT). The LUT will output a predistortion signal to be combined with the input signal, wherein the predistortion signal is a function of the input signal's amplitude.

Prior art implementations of predistortion LUTs use an "offline" method to train, or modify the LUT. This might entail the usage of a test signal that sweeps the dynamic range of the PA using a relatively slow ramp of amplitude input to the transmitter. Such a method allows the system transients, caused by normal system filtering, to settle out at each amplitude level and provides an accurate method to measure the PA distortion for each distinct LUT entry. Unfortunately, this method of training requires the normal transmitter operation to be temporarily interrupted, which is acceptable only prior to normal transmitter operation, such as during factory tuning. While the transmitter is operating in its normal mode, any changes in the PA characteristic due to environmental, loading, or aging effects will require a modification to the LUT to maintain acceptable predistortion performance. Thus, a method and apparatus for predistortion training in a PA during normal transmitter operation is therefore highly desirable.

Notwithstanding the above, some retraining methods that optimize during normal transmitter operation seek to modify each LUT coefficient independent of the others by attempting to correlate a measured PA output error with a given LUT coefficient. This turns problematic when typical system filtering is encountered because a given PA output signal becomes a function of the current signal sample and several previous signal samples as well. The resulting LUT in such a system will be generally more noisy than can be tolerated. Any predistortion training should minimize the problems associated with modifying each LUT coefficient independently.

DETAILED DESCRIPTION OF THE DRAWINGS

To address the above-mentioned need, a method and apparatus for predistortion training in an amplifier system using predistortion is provided herein. Predistortion training takes place by collecting a series of measured errors and sorting the measured errors into various amplitude regions. The entire LUT is directly modified based on a curve-fit modification in response to the average error values for each amplitude region. By utilizing this curve-fitting technique, the pitfalls of modifying individual LUT coefficients is avoided. Particularly, because the errors are collected in relatively broad regions and then averaged, the importance of exact correlation between a measured error and a specific LUT entry is significantly lessened.

The present invention encompasses a method for predistortion training in an amplifier using predistortion. The method comprises the steps of receiving an input signal, determining an amplitude of the input signal, and associating the amplitude of the input signal with an amplitude region. An amplification error is received for the input signal and an average amplification error is then determined for the amplitude region. A predistortion LUT is then modified based on the average amplification error for the amplitude region, and finally the input is pre-distorted signal utilizing the LUT.

The present invention additionally encompasses an apparatus comprising a comparison block determining an amplification error, and a LUT re-trainer receiving an input signal having a first amplitude and the amplification error and modifying LUT values based on the first amplitude and the amplification error. The LUT re-trainer modifies LUT values by determining an average error for an amplitude region containing the first amplitude and modifying a curve-fit formula based on the average error.

Figure 1:
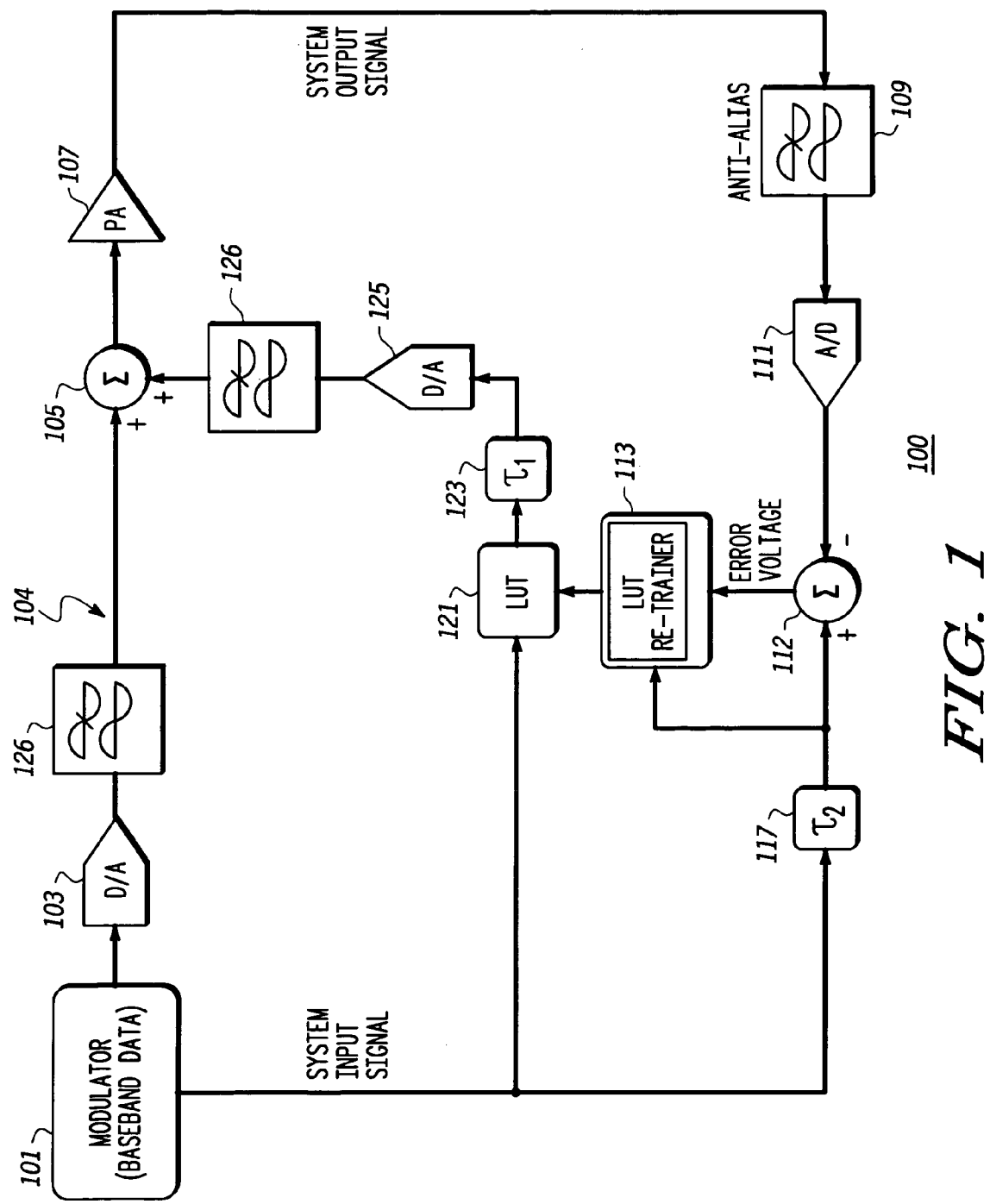
FIG. 1 is a block diagram of predistortion circuitry.

Turning now to the drawings, wherein like numerals designate like components, FIG. 1 is a block diagram of predistortion circuitry 100 that utilizes curve fitting techniques to smoothly modify the LUT in response to average error values. As shown, circuitry 100 comprises modulator 101 that generates an input signal into PA 107. LUT 121 receives the input signal as well, and outputs a predistortion value that will be combined (via summer, or pre-distorter 105) with the input signal prior to entering PA 107. It should be noted that in the preferred embodiment of the present invention the combination takes place via summer 105 summing the predistortion with the input signal, however in alternate embodiments other combination methods (e.g., subtraction, multiplication, etc.) may be utilized. As discussed above, a challenge for any digital predistortion linearization system is to create and maintain accuracy of LUT 121 in presence of a changing PA characteristics. Because of this, LUT re-trainer 113 is provided. Particularly, re-trainer 113 analyzes error voltages generated by comparison block 112 and retrains LUT 121 accordingly. In order to avoid the pitfalls of prior-art LUT retraining, a curve-fitting technique is utilized to produce LUT coefficients. Particularly, error signals based on the PA output signal relative to the system input signal are detected and assigned to regions of the amplitude-addressed LUT. An average error is determined for each "region" and curve fitting modification takes place in response to the average error values. A smooth LUT 121 is generated based on the curve-fit data.

During operation of circuitry 100 a modulation signal (input signal) is generated by signal processor 101 and sent to the main reference path 104 of the system. This signal is also sent to LUT 121, which generates an LUT index based on the amplitude of the reference signal. LUT 121 then supplies a correction value, on a sample-by-sample basis, to summer 105 after appropriate time alignment (via aligner 123) and D/A conversion (via converter 125). Main signal path 104 comprises digital-to-analog D/A converter 103 to convert the input signal to analog, however this placement in the figure is optional. Thus, summation block 105 in the analog domain is shown as the method of applying the LUT correction to the reference signal, but this could also be represented as a multiplication and could be performed in the digital domain without a loss of generality. Additionally, main signal path 104 comprises filter 126 to perform data converter reconstruction filtering, which is a commonplace method to limit system noise.

To facilitate training of LUT 121, a comparison of the reference signal to the PA 107 output signal is performed by comparison block 112 so that error signals for the magnitude and phase components can be determined. Although not necessary, FIG. 1 depicts the comparison being performed in the digital domain (after A/D conversion via converter 111), however, one of ordinary skill in the art will recognize that comparison may performed in the analog domain. Additionally, and for simplicity, FIG. I shows only a single error being generated and supplied to re-trainer 113. As one of ordinary skill in the art would recognize, a more detailed system diagram would also include a second parallel error path to represent both magnitude and phase error signals.

Continuing, analog low-pass filter 109 is utilized prior to the analog-to-digital conversion in the feedback path to prevent aliasing. It is important to note that this anti-aliasing filter is more restrictive than the reconstruction filtering used on the output of the digital-to-analog converters (DACs) in the system's forward path that feeds the PA input because the ADC is clocked at a lower sample rate. This difference in filter bandwidth typically occurs because the industry has seen DAC technology clearly outpace ADC technology in terms of sampling frequency—usually by more than a 2-to-1 margin.

To update LUT 121 with a retraining algorithm, the digitized error voltage is time-aligned with reference signal so that an accurate comparison can be made. Time delay block 117 is utilized for this purpose. The retraining algorithm in the present invention utilizes curve fitting of the LUT to provide an advantage over traditional methods of modifying the LUT. In a preferred embodiment, a B-spline curve-fitting algorithm is utilized. As one of ordinary skill in the art will recognize, B-splines are a specific type of parametric curves that have computational advantages. In alternate embodiments other sets of parametric curves (splines, polynomials, . . . etc) could be used.

B-spline-based curve fitting is a method that provides distinct advantages over other curve fitting methods for predistortion purposes. With a B-spline method, a region of the curve to be fitted, in this case a digital predistortion LUT, can be modified in a smooth manner without affecting the remaining portions of the shape. Also, it is simple to correlate PA 107 output error to the necessary curve-fit coefficients. In the preferred embodiment of the present invention each amplitude "region" of the LUT will have its own B-spline coefficient to that particular region. A B-spline fitting method is typically built upon a single basis function, B(t), that can be generated by the following equation:

$B_n(t)=\frac{1}{6}K_n*(2+t)^3$ for $-2<t\leq-1$ $B_n(t)=\frac{1}{6}K_n*(2-6t^2-3t^3)$ for $-1<t\leq0$ $B_n(t)=\frac{1}{6}K_n*(2-6t^2+3t^3)$ for $0<t\leq1$ $B_n(t)=\frac{1}{6}K_n*(2-t)^3$ for $1<t<2$ $B_n(t)=0$ otherwise    Equation 1

In equation 1, t represents an index or amplitude value, while $K_n$ represents a constant, or B-spline "knot" scaling value of the nth basis function.

Figure 2:
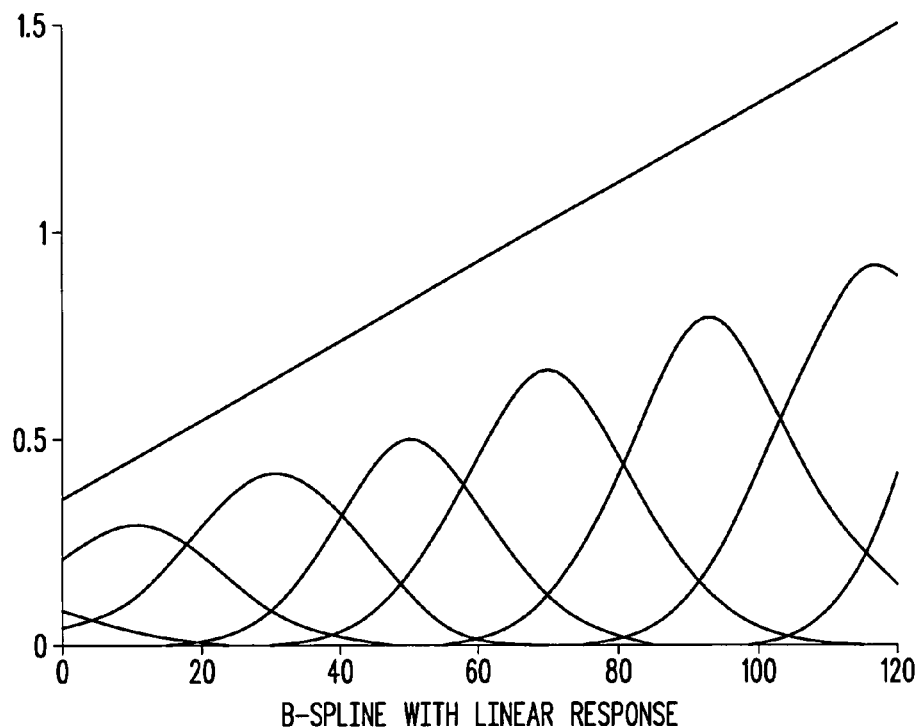
FIG. 2 illustrates a B-Spline curve fit with a linear response.
Figure 3:
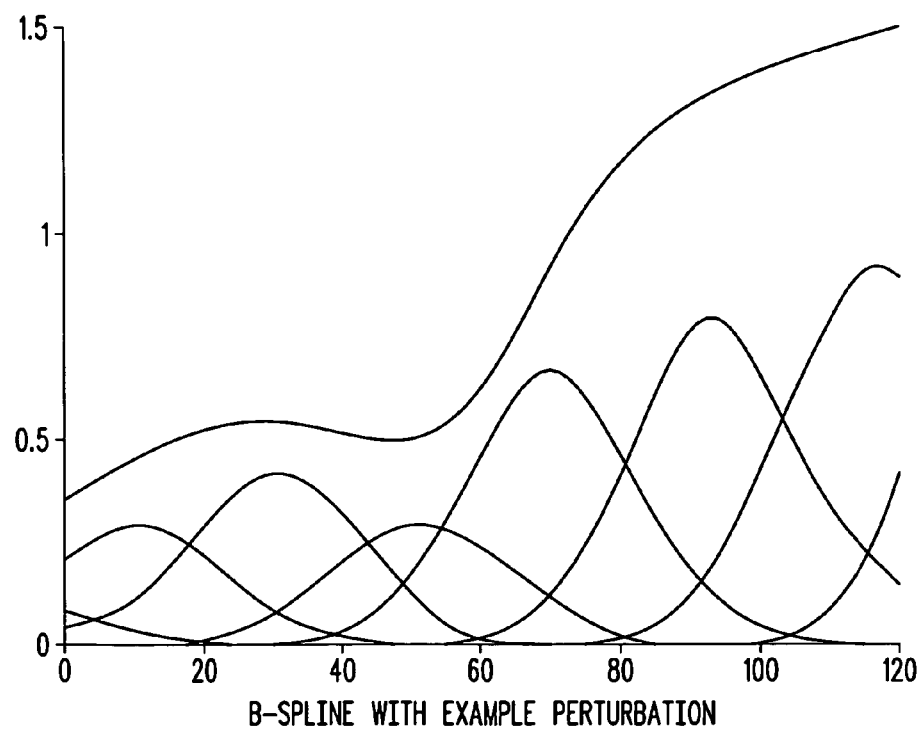
FIG. 3 illustrates B-spline curve fitting with perturbation.

Other equations could be used as the basis function, but this particular function is useful because adjacent replications of this function, shifted by 25%, have a summation of unity. FIG. 2 shows a curve generated by a typical B-spline fitting method, where six appropriately scaled versions of the single basis function are added together to achieve a smooth composite line. In relation to Equation 1, the horizontal axis would be described by the independent variable, t, and the vertical axis would be described by the dependent variable, $B_n(t)$, where $1\leq n\leq 6$. When the composite line is used as a predistortion LUT, the horizontal axis transforms into the LUT index number, which corresponds to amplitude of the modulation signal, and the vertical axis represents the correction value to apply for predistortion. The scaling factor for each of the six basis functions form an array of coefficients, K, that are commonly referred to as "knots". (For reasons unimportant to this discussion, basis functions are added to each end of the system to maintain well-behaved endpoints of the LUT). FIG. 3 shows a curve generated by modifying the value of a single knot. It can be seen that a region of the curve in the vicinity of the knot is smoothly modified without affecting other regions. This can be contrasted with curve fitting that uses a polynomial or other common closed-form equations, where all coefficients are dependent upon each other to generate a given shape. In such a situation, a change to a single coefficient creates a change to the overall shape of the curve. Likewise, to create a change in a particular portion of the curve with a closed-form equation, complicated mathematical computations are required to determine the new coefficients of the equation.

To accommodate changes in the shape of PA nonlinearity due to environmental or system changes, LUT 121 modification can be guided by changes in the knot values. The coefficients of a B-spline curve are directly related to amplitude of the signal (via the LUT index), so this can be easily leveraged to make changes in an LUT based on observations of the PA output error data. By using appropriate time alignment of the input reference signal and the observed PA output error data, the error contributions of various regions are used to modify the appropriate knot value.

Figure 4:
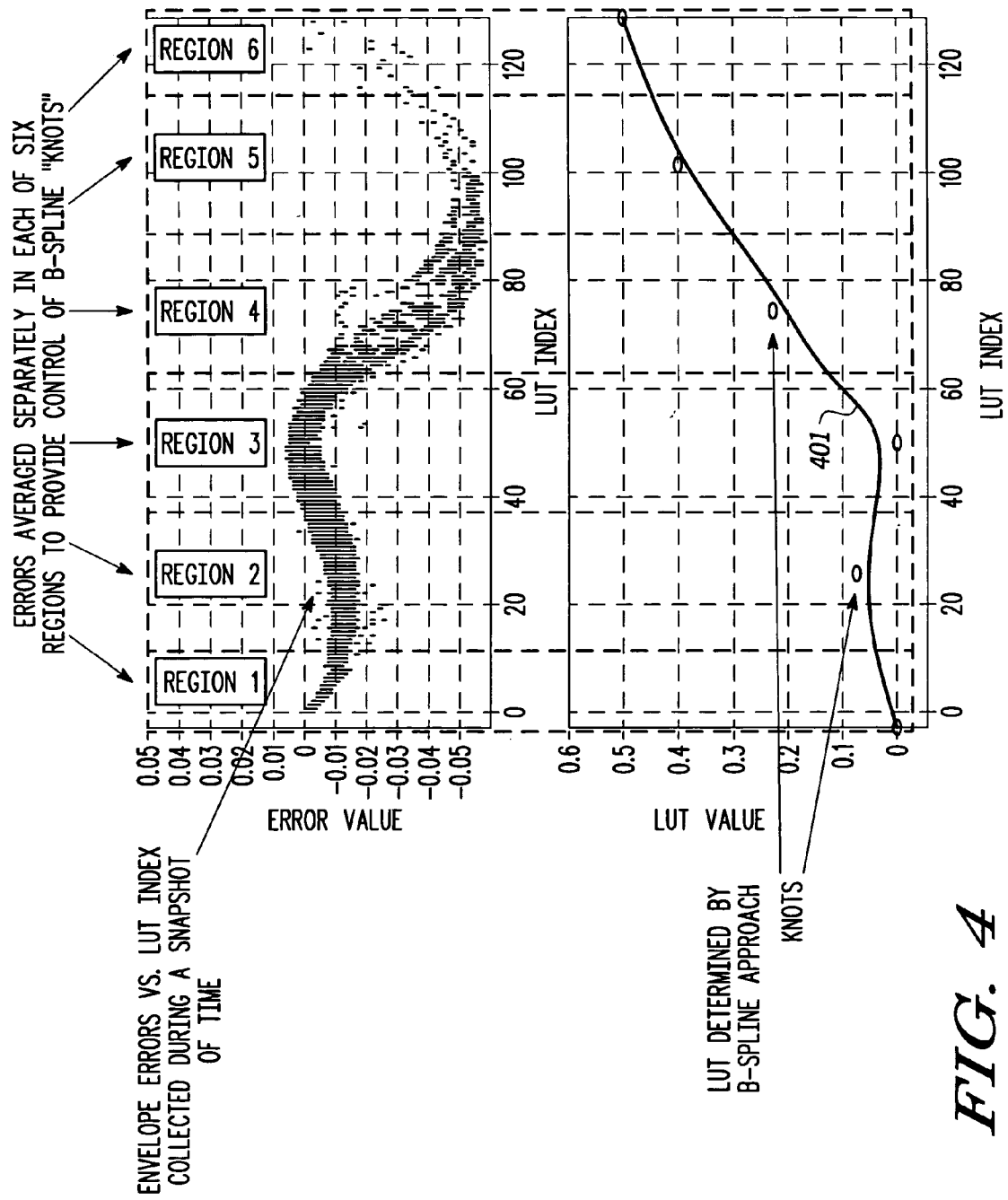
FIG. 4 illustrates binning and curve fitting error data.

FIG. 4 shows an example of how the amplification error samples are utilized to modify the respective knot values in this manner. The scatter-plot data at the top shows the error samples sorted by amplitude (LUT index). The dotted vertical lines demark the regions of error signal that correspond to a given knot value, while the LUT table and knot values are shown in the bottom portion of the figure. LUT re-trainer 113 measures the error samples in a specific region and averages the samples for the region. The average error for the region is used to modify the corresponding knot value. In this example, a 128-level LUT is adapted using a 6-knot B-spline curve. The inner four knots are modified based on the errors at the 26 LUT indices centered around that knot, while the outer two knots are modified based on the errors measured at the outer 14 LUT indices. Other values of LUT size and number of knots would require appropriate sorting into approximately equal region sizes. In the simplest implementation, the average of all error samples in a region could be used to drive the algorithm. Another technique would consist of performing a weighted average of the error samples within each region to provide greater weighting to error samples in the middle of the region. A weighting function with a shape similar to the basis function (Equation 1) could be used for this purpose. It should also be noted that the N-point LUT and the spacing of the knots do not have to be evenly mapped to the amplitude of the input signal. More LUT levels and/or more knots could be concentrated in different regions to provide greater control if desired.

In the topology of FIG. 1, where the error signal is generated via comparison block 112 subtracting PA 107 output signal from the system input signal, the sign of the error voltage indicates the direction of movement in the LUT that is required for error minimization. For example, considering the amplitude compression of a PA, a positive error indicates the PA output is compressed relative to the PA input, indicating the need for positive shift in the LUT value. In the context of a B-spline fit of the LUT, such as in FIG. 4, this simple relationship between LUT and measured error can be used to update the knot values. For example, a positive shift of the knot in region 3 will drive the average error voltage in region 3 to become smaller.

Figure 5:
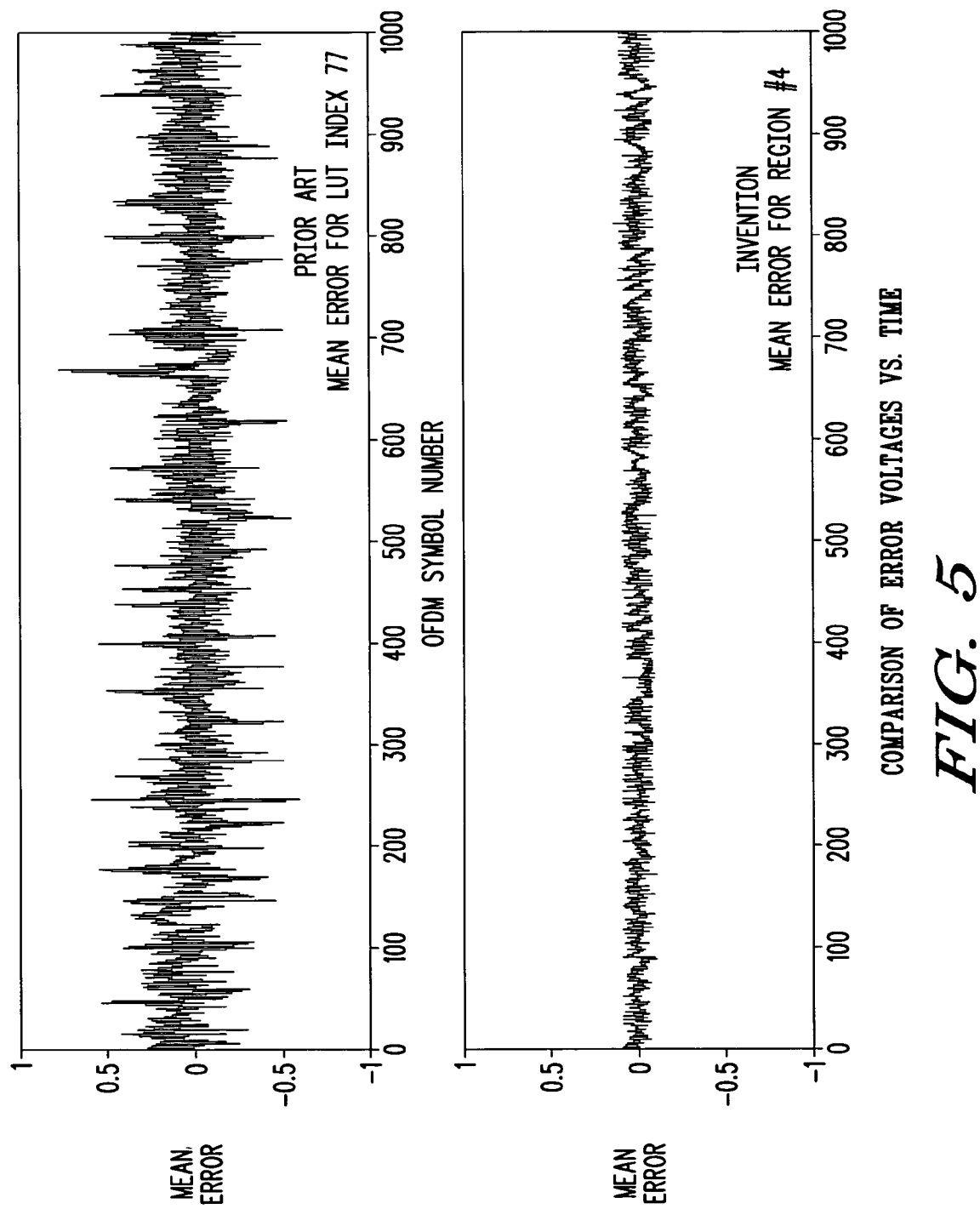
FIG. 5 is a comparison of mean error voltages vs. time.

The benefit of the B-spline LUT method as compared to the level-by-level LUT update method can be further appreciated by observing the performance of a system that has been fully trained and is operating in a "maintenance" mode—wherein the nominal error signal would ideally be zero. In the examples given above, the system was operated with a 128-level LUT and fully trained with a 6-knot B-spline retraining algorithm. FIG. 5 compares, in the time domain (plotted on the horizontal axis in terms of Orthogonal Frequency Division Multiplexed (OFDM) symbol number) the envelope error voltage corresponding to a single LUT index with the error that would update a specific B-spline knot. Specifically, the error voltage corresponding to LUT index #77, averaged within the timeframe of a single OFDM symbol, is plotted in the top half and the mean error of the B-spline region that encompasses 26 LUT indices centered at index #77 is plotted in the bottom half. The plot depicts a timeframe of 1000 OFDM symbols and shows that, in this particular example, the variance of error voltage at the specific level is roughly 19 times greater than that of the variance of the averaged error voltage in the corresponding B-spline region. Other specific LUT indices show a similar, but uncorrelated, statistical distribution. This highlights the benefit of the above procedures by showing the reduction in LUT update variability in the presence of normal system filter effects that cannot be fully compensated as well as that due to the effects of finite LUT quantization.

Figure 6:
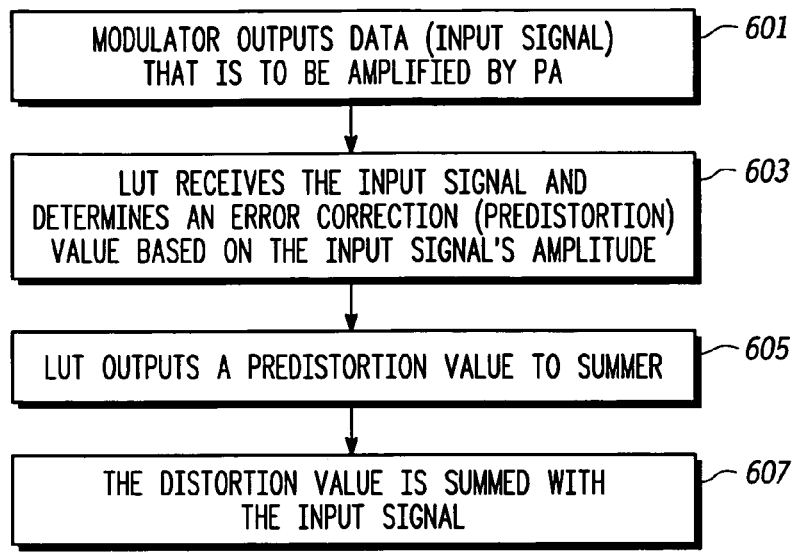
FIG. 6 is a flow chart showing operation of the predistortion circuitry of FIG. 1.

FIG. 6 is a flow chart showing operation of circuitry 100. The logic flow begins at step 601 where modulator 101 outputs data (input signal) that is to be amplified by PA 107. PA 107 is assumed to have a nonlinearity that is strictly dependent on the input signal amplitude. At step 603 LUT 121 is provided the input signal and determines an error correction (predistortion) value based on the input signal's amplitude. As discussed above, LUT 121 is continuously trained by the LUT re-trainer based on an algorithm that curve fits LUT values to average error values within amplitude "regions". LUT 121 outputs a predistortion value to summer 105 (step 605) and the predistortion value is summed with the input signal at step 607.

Figure 7:
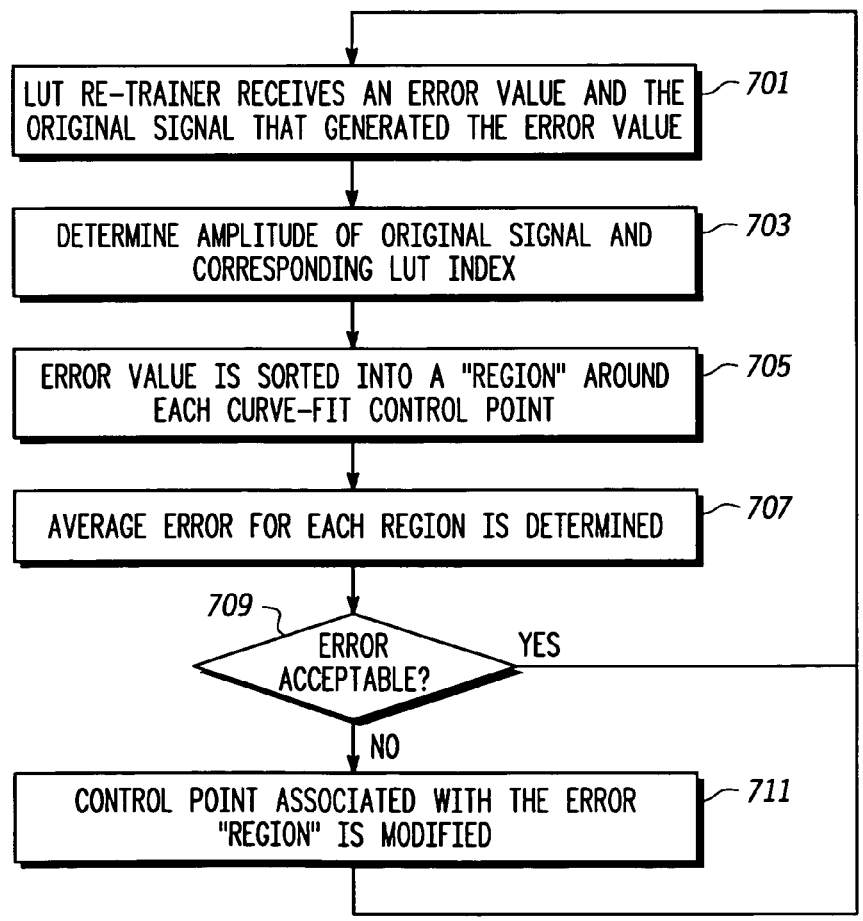
FIG. 7 is a flow chart showing operation of the LUT re-trainer of FIG. 1.

FIG. 7 is a flow chart showing operation of LUT re-trainer 113. The following discussion assumes LUT re-trainer 113 is supplied with the same correction values as LUT 121. The correction values may be factory-generated, or LUT re-trainer 113 may have initially attempted to generate these values. Regardless of how LUT 121 and re-trainer 113 obtain initial LUT values, LUT re-trainer 113 continuously re-trains LUT 121 via the following procedure.

The logic flow begins at step 701 where LUT re-trainer 113 receives an amplification error value and the original signal (baseband data) that generated the error value. At step 703 the amplitude of the original signal is determined, and a corresponding LUT index derived from the amplitude. In the preferred embodiment of the present invention LUT index is linearly proportional to the original signal's amplitude. At step 705 the amplitude (or LUT index) is associated with an amplitude region having an associated curve-fit region, or control point (e.g., polynomial or B-spline knot). More particularly, the amplitude (A) is associated with a region bounded by $A_{min}$ and $A_{max}$ such that $A_{min} < A < A_{max}$. As discussed above, there exists a plurality of amplitude regions. An average amplification error for each region is determined at step 707 and the error's acceptability is determined at step 709. Whether or not an error for each region is determined acceptable is based on the type of application utilizing circuitry 100. Systems requiring higher linearity performance would drive towards lower average error, at the expense of longer training time. Tradeoffs such as this would be decided upon during system design.

Continuing, if at step 709 it is determined that the error is acceptable, the logic flow returns to step 701, otherwise the logic flow continues to step 711 where the existing curve-fit formula is modified and LUT 121 is updated based on the average amplification error for the amplitude region. More particularly, since the amplitude region comprises curve-fit data 401, and since the curve-fit data utilized produced an error that is unacceptable, the curve-fit data is determined and modified to reduce the error. When a B-spline method is utilized to generate data 401, at least one existing knot in the B-spline curve is modified. Other parametric curves, of which B-splines are a subset, could also be used to generate data 401, whereby at least one parametric curve would be modified to reduce the error. Alternatively, if polynomial curve-fitting is utilized, then the entire curve-fit formula used to generate 401 is modified based on a recalculation to minimize the average amplification error. This may entail re-fitting the entire polynomial based on the amplification error data. The logic flow then returns to step 701.

While the invention has been particularly shown and described with reference to a particular embodiment, it will be understood by those skilled in the art that various changes in form and details may be made therein without departing from the spirit and scope of the invention. It is intended that such changes come within the scope of the following claims.

The invention claimed is:

1. A method for predistortion training in an amplifier using predistortion, the method comprising the steps of:
   receiving an input signal;
   determining an amplitude of the input signal;
   associating the amplitude of the input signal with one of a plurality of amplitude regions, wherein the amplitude region is associated with a plurality of LUT indices;
   determining an average amplification error for the amplitude region by averaging a plurality of received amplification errors associated with the amplitude region, wherein the plurality of received amplification errors are associated with different LUT indices;
   modifying a predistortion LUT based on the average amplification error for the amplitude region; and
   predistorting the input signal utilizing the LUT.

2. The method of claim 1 wherein the step of modifying the predistortion LUT based on the average amplification error comprises the step of:

determining if the average amplification error exceeds a predetermined value;
determining an existing curve-fit formula that is utilized by the LUT to generate predistortion values;
modifying the existing curve-fit formula based on the average amplification error; and
updating the LUT with the modified curve-fit formula.

3. The method of claim 2 wherein the step of determining the existing curve-fit formula comprises the step of determining a current set of parametric equations.

4. The method of claim 2 wherein the step of determining the existing curve-fit formula comprises the step of determining a current polynomial equation.

5. The method of claim 1 wherein the step of modifying the predistortion LUT based on the average amplification error comprises the steps of:
determining if the average amplification error exceeds a predetermined value;
determining existing knots in a B-spline curve;
modifying at least one existing knot in the B-spline curve; and
updating the LUT with the modified B-spline curve.

6. The method of claim 1 wherein the step of receiving the input signal comprises the step of receiving modulated baseband data.

7. The method of claim 1 wherein the step of associating the amplitude of the input signal with an amplitude region comprises the step of associating the input signal with region bounded by $A_{min}$ and $A_{max}$ such that $A_{min} < A < A_{max}$.

8. The method of claim 1 wherein the step of receiving the amplification error for the input signal comprises the step of receiving an amplitude and phase error between the input signal and the amplified signal.

9. An apparatus comprising:
a comparison block determining an amplification error;
a LUT re-trainer receiving an input signal having a given amplitude and amplification error and modifying LUT values based on the given amplitude and the amplification error, wherein the LUT re-trainer modifies LUT values by determining an average error for an amplitude region containing the given amplitude by averaging a plurality of received amplification errors associated with the amplitude region, wherein the plurality of received amplification errors are associated with different LUT indices and modifying a predistortion LUT based on the average error; and
a LUT outputting the modified LUT values to a predistorter to be combined with a baseband input signal.

10. The apparatus of claim 9 wherein the LUT re-trainer modifies LUT values based on a curve-fit formula.

11. The apparatus of claim 10 wherein the curve-fit formula comprises curve fitting to a B-spline, and wherein the LUT re-trainer modifies B-spline knots based on the average error.

12. The apparatus of claim 10 wherein the curve-fit formula comprises curve fitting with a set of parametric curves.

13. The apparatus of claim 10 wherein the curve-fit formula comprises curve fitting with a polynomial.

14. The apparatus of claim 9 wherein the comparison block comprises summing circuitry having an amplified signal and the input signal as an input and outputting the amplification error.

* * * * *